United States Patent
Jisong

(10) Patent No.: US 11,011,416 B2
(45) Date of Patent: May 18, 2021

(54) SEMICONDUCTOR STRUCTURE AND METHOD FOR FORMING A SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventor: Jin Jisong, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 25 days.

(21) Appl. No.: 16/530,180

(22) Filed: Aug. 2, 2019

(65) Prior Publication Data
US 2020/0343132 A1 Oct. 29, 2020

(30) Foreign Application Priority Data
Apr. 29, 2019 (CN) .......................... 201910356549.7

(51) Int. Cl.
 *H01L 21/768* (2006.01)
 *H01L 23/528* (2006.01)
 *H01L 23/522* (2006.01)
(52) U.S. Cl.
 CPC .... *H01L 21/76829* (2013.01); *H01L 21/7682* (2013.01); *H01L 21/76802* (2013.01);
(Continued)

(58) Field of Classification Search
CPC ......... H01L 21/76829; H01L 21/76877; H01L 21/7682; H01L 21/76802; H01L 23/5226; H01L 23/5283
See application file for complete search history.

(56) References Cited

U.S. PATENT DOCUMENTS 9,281,277 B2 * 3/2016 Baek ................... H01L 21/7684
9,553,019 B1 * 1/2017 Briggs .............. H01L 21/76829
(Continued)

*Primary Examiner* — Karen Kusumakar
(74) *Attorney, Agent, or Firm* — Brinks Gilson & Lione

(57) ABSTRACT

A semiconductor structure and a method for forming a semiconductor structure are provided. One form of the method includes: providing a base, a bottom dielectric layer formed on the base, and an interconnecting wire located within the bottom dielectric layer, where the bottom dielectric layer exposes a top of the interconnecting wire; etching a portion of a thickness of the bottom dielectric layer, along an extending direction of the interconnecting wire, where adjacent interconnecting wires and a remainder of the bottom dielectric layer form a groove; forming an etch stop layer at least in the groove, the etch stop layer sealing a top of the groove; forming a top dielectric layer covering the interconnecting wire, the etch stop layer, and the bottom dielectric layer; forming a via within top dielectric layers on both sides of the groove, the via exposing the top of the interconnecting wire; forming a via interconnecting structure filling the via, the via interconnecting structure being electrically connected to the interconnecting wire. Embodiments and implementations of the present disclosure provide reliability and stability of the semiconductor structure while enlarging a process window for forming the via and improving a degree of freedom of a layout design of the via interconnecting structure.

21 Claims, 10 Drawing Sheets

(52) U.S. Cl.
CPC .... *H01L 21/76877* (2013.01); *H01L 23/5226* (2013.01); *H01L 23/5283* (2013.01)

(56) References Cited

U.S. PATENT DOCUMENTS

2016/0372415 A1* 12/2016 Siew .................... H01L 21/7682
2016/0379871 A1* 12/2016 Tsai ................. H01L 21/76885
257/774

* cited by examiner

SEMICONDUCTOR STRUCTURE AND METHOD FOR FORMING A SEMICONDUCTOR STRUCTURE

RELATED APPLICATIONS

The present application claims priority to Chinese Patent Appln. No. 201910356549.7, filed Apr. 29, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming a same.

Related Art

An existing semiconductor structure is generally composed of one semiconductor substrate and a plurality of dielectric layers and conductive layers formed on the semiconductor substrate. In particular, a plurality of dielectric layers may be formed on the substrate through forming another dielectric layer on a dielectric layer, and each dielectric layer contains at least one metal wire, and each dielectric layer containing at least one metal line may be referred to as a metal layer. The existing semiconductor structure is composed of a plurality of metal layers, and metal wires within the metal layers can be electrically connected to each other through a via interconnecting structure.

The existing via interconnecting structure is generally formed using a damascene process. In particular, after a first metal wire is formed within the dielectric layer of the metal layer, a trench or an opening may be formed within the dielectric layer to expose an upper surface of the first metal wire. The trench or the opening may be filled with a gasket material and metal as needed, and the metal (and the gasket) can be flattened to a top surface of the dielectric layer. Afterwards a second metal wire can be formed over the metal and the dielectric layer to enable the metal to be electrically connected to the first metal wire and the second metal wire. After each metal wire is formed in each metal layer, the process continues as needed to provide an electrical connection between the metal wires within the metal layer as needed.

SUMMARY

A problem to be addressed by embodiments and implementations of the present disclosure is to provide a semiconductor structure and a method for forming a semiconductor structure, and to ensure reliability and stability of the semiconductor structure while enlarging a process window for forming a via.

To address the foregoing problem, one form of the present disclosure provides a method for forming a semiconductor structure. The method includes: providing a base, a bottom dielectric layer formed on the base, and an interconnecting wire located within the bottom dielectric layer, where the bottom dielectric layer exposes a top of the interconnecting wire; etching a portion of a thickness of the bottom dielectric layer, along an extending direction of the interconnecting wire, where adjacent interconnecting wires and a remainder of the bottom dielectric layer form a groove; forming an etch stop layer at least in the groove, the etch stop layer sealing the top of the groove; forming a top dielectric layer covering the interconnecting wire, the etch stop layer, and the bottom dielectric layer; forming a via within top dielectric layers on both sides of the groove, the via exposing the top of the interconnecting wire; forming a via interconnecting structure filling the via, the via interconnecting structure being electrically connected to the interconnecting wire.

In some implementations, embodiments and implementations of the present disclosure further provide a semiconductor structure. One form of a semiconductor includes: a base; a bottom dielectric layer located on the base; an interconnecting wire located within the bottom dielectric layer, where a top of the interconnecting wire is higher than a top of the bottom dielectric layer, and along an extending direction of the interconnecting wire, adjacent interconnecting wires and the bottom dielectric layer form a groove; an etch stop layer located at least in the groove and sealing the top of the groove; a top dielectric layer covering the interconnecting wire, the etch stop layer, and the bottom dielectric layer; a via interconnecting structure located within top dielectric layers on both sides of the groove, the via interconnecting structure being electrically connected to the interconnecting wire.

Compared with the prior art, technical solutions of the embodiments and implementations of the present disclosure have the following advantages:

In some implementations of the present disclosure, the portion of the thickness of the bottom dielectric layer is etched, along the extending direction of the interconnecting wire, where adjacent interconnecting wires and the remainder of the bottom dielectric layer form the groove; the etch stop layer is formed at least in the groove, the etch stop layer sealing the top of the groove, and in an etching process for forming the via within the top dielectric layers located on both sides of the groove subsequently, the etch stop layer located on the top of the groove can define an etch stop position, and it is difficult to cause mis-etching to an etch stop layer between adjacent interconnecting wires in the via etching process, thereby reducing a probability that the via exposes the adjacent interconnecting wires, or the via is prevented from being extremely close to the adjacent interconnecting wires, and after the via interconnecting structure filling the via is formed subsequently, a probability that a short circuit occurs between the via interconnecting structure and the adjacent interconnecting wires is relatively low, thereby ensuring reliability and stability of the semiconductor structure while enlarging a process window for forming the via and improving a degree of freedom of a layout design of the via interconnecting structure.

DETAILED DESCRIPTION

In a current method for forming a semiconductor structure, a process window for forming a via interconnecting structure is relatively small, and a layout design of the via interconnecting structure is limited relatively greatly. A method for forming a semiconductor structure is now combined to analyze reasons why the process window for forming the via interconnecting structure is relatively small.

Referring to FIG. 1 to FIG. 4, schematic structural diagrams of steps in a method for forming a semiconductor structure are shown.

Figure 1:
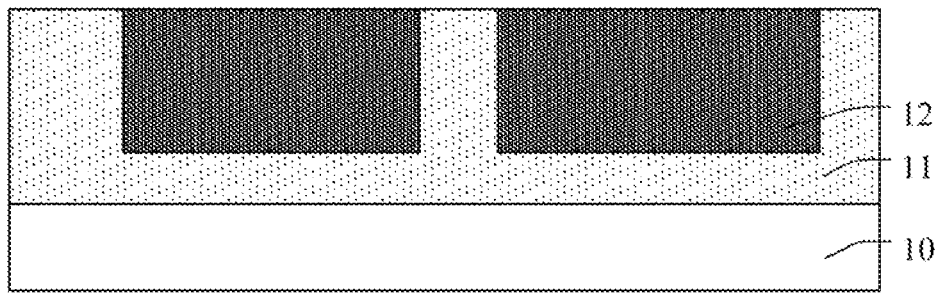
FIG. 1 to FIG. 4 are schematic structural diagrams of steps in one form of a method for forming a semiconductor structure.

Referring to FIG. 1, a schematic diagram of a profile along an extending direction of an interconnecting wire is shown. A base 10 is provided, a bottom dielectric layer 11 and an interconnecting wire 12 located within the bottom dielectric layer 11 being formed on the base 10, and the bottom dielectric layer 11 exposing the top of the interconnecting wire 12.

Figure 2:
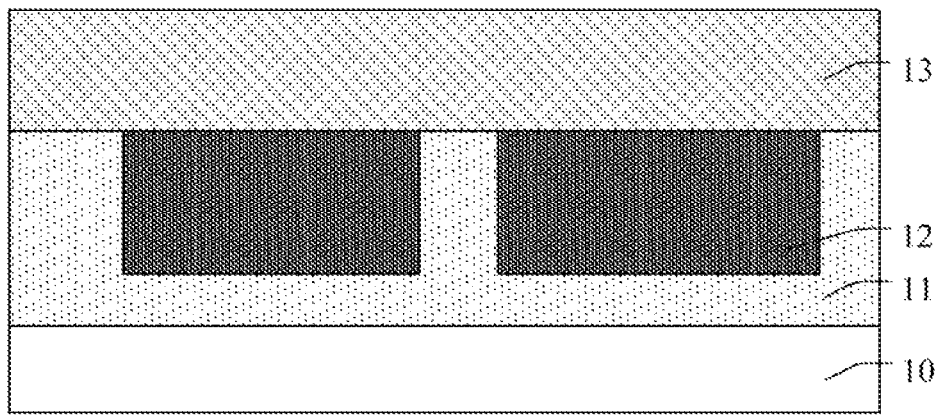

Referring to FIG. 2, a top dielectric layer 13 covering the interconnecting wire 12 and the bottom dielectric layer 11 is formed.

Figure 3:
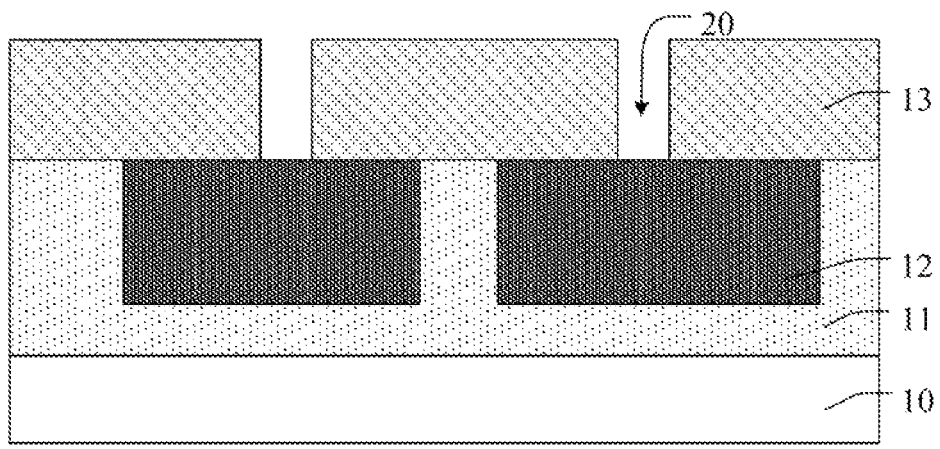

Referring to FIG. 3, a via 20 is formed within the top dielectric layer 13 on the top of the interconnecting wire 12, the via 20 exposing the top of the interconnecting wire 12.

Figure 4:
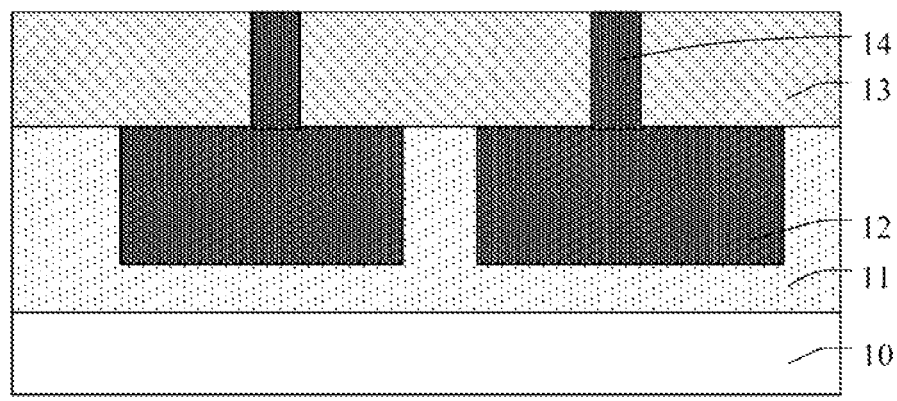

Referring to FIG. 4, a via interconnecting structure 14 filling the via 20 is formed, the via interconnecting structure 14 being electrically connected to the interconnecting wire 12.

With continuous improvement of a level of a process for manufacturing a semiconductor device and the rapid development of an integrated circuit, a size of a device is further reduced. Along the extending direction of the interconnecting wire 12, a distance between adjacent interconnecting wires 12 continues to be shortened, and in the step of forming the via 20, there is usually an overlay shift. Therefore, a position for forming the via 20 is usually far away from a region between the adjacent interconnecting wires 12, that is, it is usually difficult for the via 20 to be formed on an edge of the interconnecting wire 12, to prevent mis-etching from being caused to a bottom dielectric layer 11 located between the adjacent interconnecting wires 12 in an etching process for the forming the via 20, thereby preventing a short circuit from occurring between the via interconnecting structure 14 and the adjacent interconnecting wires 12 due to an extremely close distance. This helps provide reliability and stability of the semiconductor structure. However, this is likely to increase difficulty of a layout design of the via interconnecting structure 14, reduce a degree of freedom of the layout design, and reduce a process window for forming the via 20.

Therefore, there is an urgent need for a method for forming a semiconductor structure, to enlarge the process window for forming the via and improve the degree of freedom of the layout design of the via interconnecting structure while ensuring the reliability and the stability of the semiconductor structure.

To address the technical problems, in embodiments and implementations of the present disclosure, a portion of a thickness of the bottom dielectric layer is etched, along an extending direction of the interconnecting wire, where adjacent interconnecting wires and a remainder of the bottom dielectric layer form a groove; an etch stop layer is formed at least in the groove, the etch stop layer sealing a top of the groove, and in an etching process for forming a via within top dielectric layers located on both sides of the groove subsequently, the etch stop layer located on the top of the groove can define an etch stop position, and it is difficult to cause mis-etching to an etch stop layer between adjacent interconnecting wires in the via etching process, thereby reducing a probability that the via exposes the adjacent interconnecting wires, or the via is prevented from being extremely close to the adjacent interconnecting wires, and after a via interconnecting structure filling the via is formed subsequently, a probability that a short circuit occurs between the via interconnecting structure and the adjacent interconnecting wires is relatively low, thereby providing the reliability and the stability of the semiconductor structure while enlarging the process window for forming the via and improving the degree of freedom of the layout design of the via interconnecting structure.

In order to make the foregoing objectives, features, and advantages of the embodiments and implementations of the present disclosure more apparent and easier to understand, specific embodiments and implementations of the present disclosure are described in detail below with reference to the accompanying drawings.

FIG. 5 to FIG. 21 are respective schematic structural diagrams of steps in one form of a method for forming a semiconductor structure.

Figure 5:
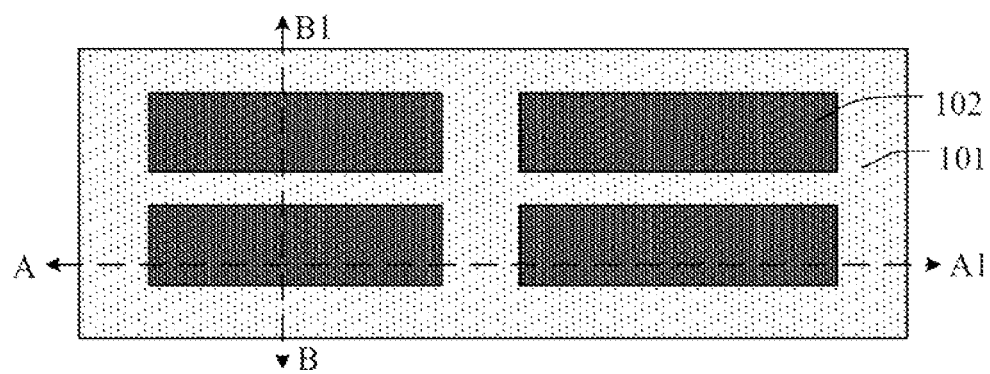
FIG. 5 to FIG. 21 are schematic structural diagrams of steps in one form of a method for forming a semiconductor structure.
Figure 6:
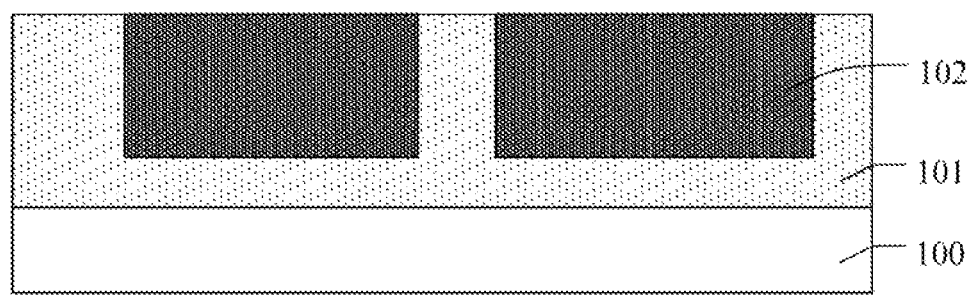
Figure 7:
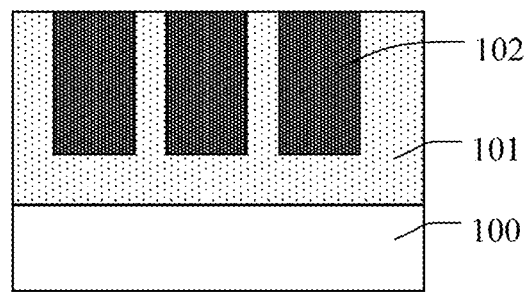

Referring to FIG. 5 to FIG. 7, a top view, a profile view of FIG. 5 along a direction AA1, and a profile view of FIG. 5 along a direction BB1 are respectively shown. A base 100 is provided, a bottom dielectric layer 101 and an interconnecting wire 102 located within the bottom dielectric layer 101 being formed on the base 100, the bottom dielectric layer 101 exposing the top of the interconnecting wire 102.

The base 100 is configured to provide a process platform for a subsequent manufacture procedure. In some implementations, for example, a formed semiconductor structure is a planar transistor. The base 100 includes a substrate (not shown in the figure).

In particular, the substrate is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In other implementations, when the formed semiconductor structure is a fin field effect transistor, the base may include a substrate and a fin protruding from the substrate correspondingly.

The base 100 may further include other structures, for example, a gate structure, a doped region, a shallow trench isolation (STI) structure, and a dielectric layer, etc. The gate structure may be a metal gate structure or a polysilicon gate structure.

In some implementations, the bottom dielectric layer 101 is an inter-metal dielectric (IMD) layer. The bottom dielectric layer 101 is configured to provide a process platform for forming the interconnecting wire 102, and the bottom dielectric layer 101 is further configured to achieve electrical isolation between adjacent interconnecting wire structures in a back end of line (BEOL) manufacture procedure.

In particular, the bottom dielectric layer 101 is a first inter-metal dielectric layer configured to achieve electrical isolation between first metal interconnecting wires (that is, M1 layers). The first interconnecting wire refers to an interconnecting structure closest to a contact plug.

In some implementations, the bottom dielectric layer may also be an inter-metal dielectric layer located on the first metal interconnecting wire configured to achieve electrical isolation between other interconnecting structures. For example, the bottom dielectric layer is a second inter-metal dielectric layer configured to achieve electrical isolation between a second metal interconnecting wire and a via interconnecting structure located between the second metal interconnecting wire and the first metal interconnecting wire.

For this purpose, the bottom dielectric layer 101 is made of a low-k dielectric material (a low-k dielectric material refers to a dielectric material having a relative dielectric constant greater than or equal to 2.6 and less than or equal to 3.9), and an ultra-low-k dielectric material (an ultra-low-k dielectric material refers to a dielectric material having a relative dielectric constant less than 2.6), silicon oxide, silicon nitride, or silicon oxynitride, etc.

In some implementations, the bottom dielectric layer 101 is made of an ultra-low-k dielectric material, to reduce a parasitic capacitance between back end of line interconnecting structures, thereby reducing a back end of line RC delay. In particular, the ultra-low-k dielectric material may be Si OCH.

The interconnecting wire 102 is configured to achieve an electrical connection between the base 100 and an external circuit or other interconnecting structures. In some implementations, the interconnecting wire 102 is a first metal (M1) interconnecting wire.

In some implementations, the interconnecting wire 102 is made of copper. A relatively low resistivity of copper facilitates improvement of a signal delay of a back end of line RC and improvement of a processing speed of a chip, and also facilitates reduction of a resistance of the interconnecting wire 102, reducing power consumption correspondingly.

In some implementations, a metal block layer (not shown in the figure) is further formed on a bottom surface, a side wall, and a top surface of the interconnecting wire 102. The metal block layer is configured to improve an adhesion between the interconnecting wire 102 and other film layer structures, and the metal block layer is further configured to block a material of the interconnecting wire 102 from spreading to the other film layer structures. In some implementations, the metal block layer is made of tantalum nitride.

Figure 8:
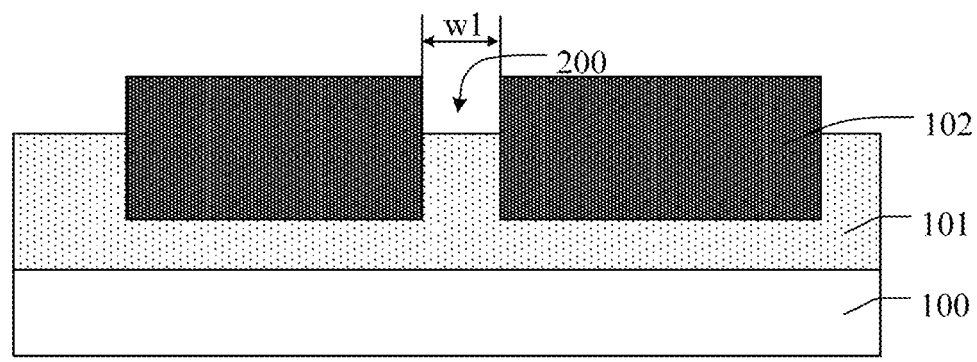
Figure 9:
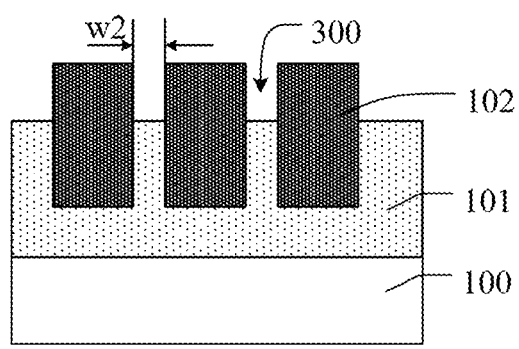

Referring to FIG. 8 to FIG. 9, FIG. 8 is a profile view based on FIG. 6, and FIG. 9 is a profile view based on FIG. 7. A portion of a thickness of the bottom dielectric layer 101 is etched, along an extending direction of the interconnecting wire 102, where adjacent interconnecting wires 102 and a remainder of the bottom dielectric layer 101 form a groove 200 (shown in FIG. 8).

The groove 200 is configured to provide a process platform for forming an etch stop layer subsequently.

A depth-to-width ratio of the groove 200 should be neither excessively small nor excessively large. If the depth-to-width ratio of the groove 200 is excessively small, when an opening width of the groove 200 remains unchanged, a depth of the groove 200 is excessively small, and a height of an etch stop layer formed subsequently in the groove 200 is relatively low correspondingly, and it is difficult for the etch stop layer to perform a block function in a subsequent via etching process. If the depth-to-width ratio of the groove 200 is excessively large, when the opening width of the groove 200 remains unchanged, the depth of the groove 200 is excessively large, and a time costed to etch the portion of the thickness of the bottom dielectric layer 101 is excessively long, not only causing a waste of process times, but also making the interconnecting wire 102 likely to be exposed in the etching process environment excessively long, which is likely to cause a loss to the interconnecting wire 102 and a metal block layer on a surface of the interconnecting wire 102. For this purpose, in some implementations, after the portion of the thickness of the bottom dielectric layer 101 is etched, the groove 200 has a depth-to-width ratio from 0.2 to 1.5.

In some implementations, the portion of the thickness of the bottom dielectric layer 101 is etched using a dry etching process. The dry etching process has anisotropic etching characteristics, which facilitates improvement of profile quality of the groove 200.

In other implementations, according to actual process requirements, the portion of the thickness of the bottom dielectric layer may be etched using a wet etching process or a process combining dry etching with wet etching.

It should be noted that, in the semiconductor field, compared with a distance between the adjacent interconnecting wires 102 along the extending direction of the interconnecting wire 102, a space between the adjacent interconnecting wires 102 along a direction perpendicular to the extending direction of the interconnecting wire 102 is usually smaller.

Therefore, after the portion of the thickness of the bottom dielectric layer 101 is etched, along the extending direction of the interconnecting wire 102, the opening width of the groove 200 is a first width w1 (shown in FIG. 8), and along the direction perpendicular to the extending direction of the interconnecting wire 102, adjacent interconnecting wires 102 and the bottom dielectric layer 101 from a trench 300 (shown in FIG. 9), an opening width of the trench 300 being a second width w2 (shown in FIG. 9), and the second width w2 being smaller than the first width w1.

Figure 10:
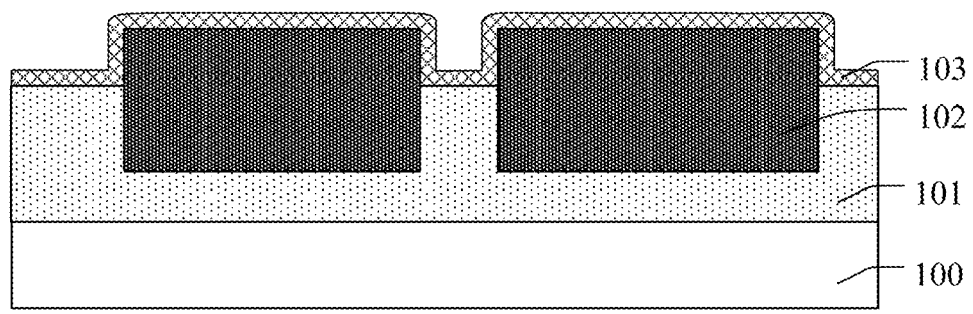
Figure 11:
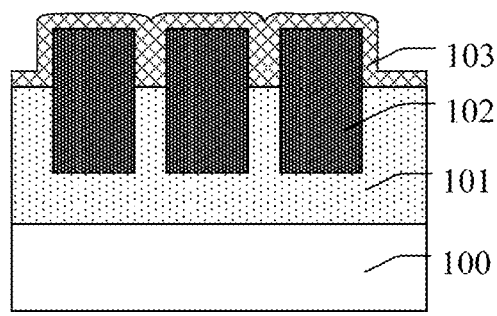

With reference to and referring to FIG. 10 to FIG. 11, FIG. 10 is a profile view based on FIG. 8, and FIG. 11 is a profile view based on FIG. 9. After the portion of the thickness of the bottom dielectric layer 101 is etched, the method further includes: forming a side wall layer 103 that covers a bottom and side walls of the groove 200 (shown in FIG. 8), as well as the top of the interconnecting wire 102 conformally, the side wall layer 103 sealing the top of the trench 300 (shown in FIG. 9).

In some implementations, the first width w1 is greater than the second width w2, that is, a depth-to-width ratio of the trench 300 is larger than that of the groove 200. The side wall layer 103 seals the top of the trench 300, to prevent an etch stop layer from being formed within the trench 300 subsequently, thereby reducing difficulty in forming the etch stop layer. In addition, the side wall layer 103 covers the bottom and the side walls of the groove 200 as well as the top of the interconnecting wire 102 conformally, so that partial space of the groove 200 is occupied, to prevent an excessively thick etch stop layer for ensuring that the subsequent etch stop layer can seal the top of the groove 200, thereby improving profile quality of the top of the etch stop layer, shortening a process time costed to forming the etch stop layer subsequently, while reducing process difficulty in forming the etch stop layer and improving process compatibility.

A dielectric constant of a material of the side wall layer 103 is lower than a dielectric constant of a material of the subsequent etch stop layer, and the side wall layer 103 is made of a low-k dielectric material, an ultra-low-k dielectric material, silicon oxide, or carbon-containing silicon oxide. Therefore, compared with a solution in which no side wall layer is formed, dispose of the side wall layer 103 in some implementations further facilitates reduction of a parasitic capacitance between the adjacent interconnecting wires 102, facilitating improvement of a TDDB (Time Dependent Dielectric Breakdown, time-related dielectric breakdown) characteristic. In some implementations, the side wall layer 103 is made of silicon oxide.

In some implementations, the side wall layer 103 further covers a bottom and side walls of the trench 300 conformally, and the side wall layers 103 located on side walls of the same trench 300 are in contact with each other, thereby filling the trench 300, and sealing the top of the trench 300 correspondingly. In particular, in a process of forming the side wall layer 103, based on a specified value of a thickness of the side wall layer 103 on the side wall of the trench 300, as a thickness of a deposited material increases, thicknesses of the side wall layers 103 on side walls of the trench 300 are gradually in contact with each other, so that a finally formed side wall layer 103 fills the trench 300.

For this purpose, in the step of forming the side wall layer 103, the thickness of the side wall layer 103 is greater than or equal to one-half of the second width w2 and less than one-half of the first width w1, so that there is still remaining space in the groove 200 for forming an etch stop layer while enabling the side wall layers 103 on the side walls of the same trench 300 to be in contact with each other.

In some implementations, the side wall layer 103 further covers the top of the bottom dielectric layer 101 and the side wall of the interconnecting wire 102.

In some implementations, the side wall layer 103 is formed using an atomic layer deposition (ALD) process. Selecting the atomic layer deposition process not only facilitates improvement of a conformal coverage capability of the side wall layer 103, but also facilitates increase of thickness uniformity and a density of the side wall layer 103, so that the thickness of the side wall layer 103 can be controlled accurately, while improving an effect of the side wall layer 103 for improving the TDDB characteristic.

In other implementations, according to actual process requirements, the side wall layer may also be formed using a chemical vapor deposition process.

Figure 12:
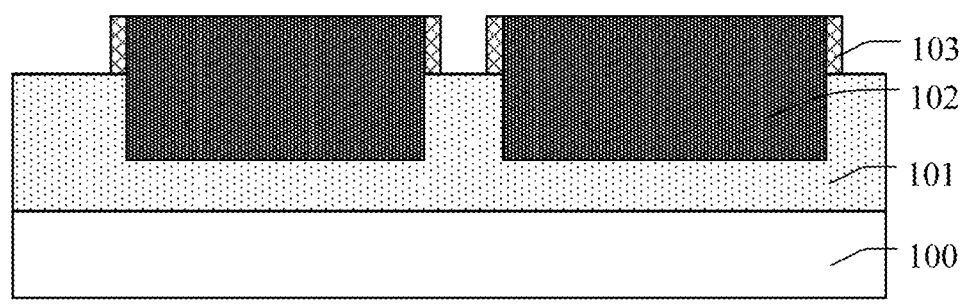
Figure 13:
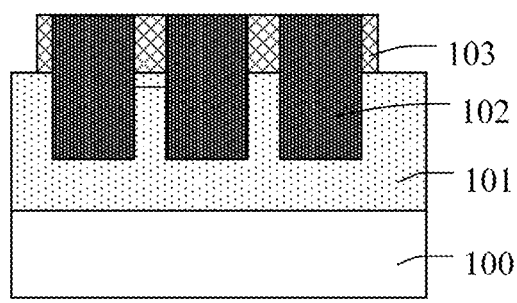

With reference to and referring to FIG. 12 to FIG. 13, FIG. 12 is a profile view based on FIG. 10, and FIG. 13 is a profile view based on FIG. 11. After the side wall layer 103 is formed, the method further includes: removing side wall layers 103 at a bottom of the groove 200 and the top of the interconnecting wire 102.

The side wall layers 103 at the bottom of the groove 200 and on the top of the interconnecting wire 102 are removed, so that an etch stop layer can be formed at the bottom of the groove 200 subsequently, which facilitates increase of a volume of the etch stop layer formed within the groove 200, correspondingly increasing an effect of the etch stop layer for preventing a short-circuit from occurring between the via interconnecting structure and adjacent interconnecting wires 102 subsequently. In addition, compared with a solution in which the side wall layer on the top of the interconnecting wire is not removed, in some implementations, the etch stop layer can be formed on the top of the interconnecting wire 102 subsequently and, in a subsequent etching process for forming the via, after the top dielectric layer on the tops of the interconnecting wire 102 and the bottom dielectric layer 101 is etched, only the etch stop layer needs to be etched, so that etching of a side wall layer at a bottom of the etch stop layer is avoided, thereby preventing a loss from being caused to the interconnecting wire 102 in steps of the etching process, and facilitating improvement of the profile quality of a subsequent via.

In some implementations, the side wall layer 103 covers the bottom and the side walls of the groove 200, the interconnecting wire 102, and the top of the bottom dielectric layer 101 conformally, and therefore side wall layers 103 at the bottom of the groove 200 and on the tops of the interconnecting wire 102 and the bottom dielectric layer 101 can be removed using a maskless etching process, saving one piece of photomask, and saving costs correspondingly.

In particular, a dry etching process is employed for performing a maskless etching process. The dry etching process has anisotropic etching characteristics, so that the side wall layers 103 at the bottom of the groove 200 and on the top of the interconnecting wire 102 and on the top of the bottom dielectric layer 101 can be removed, and a probability of causing a damage to side wall layers 103 on the side wall of the groove 200 and on the side wall of the interconnecting wire 102 can be reduced.

It should be noted that the side wall layer 103 covers the bottom and the side walls of the trench 300 conformally, and the side wall layers 103 located on the side walls of the same trench 300 are in contact with each other, and therefore, in the step of performing the maskless etching process, the side wall layer 103 located on the top of the trench 300 is etched, so that a probability of causing a damage to the side wall layer 103 located within the trench 300 is relatively small.

In other implementations, according to process requirements, the side wall layers at the bottom of the trench and on the top of the interconnecting wire may not be removed.

Figure 14:
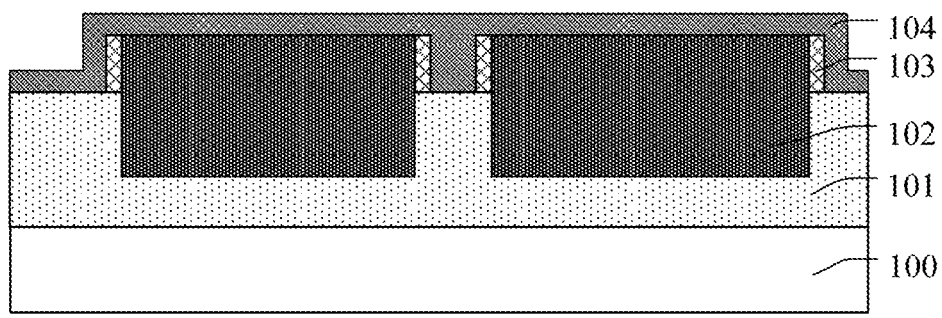
Figure 15:
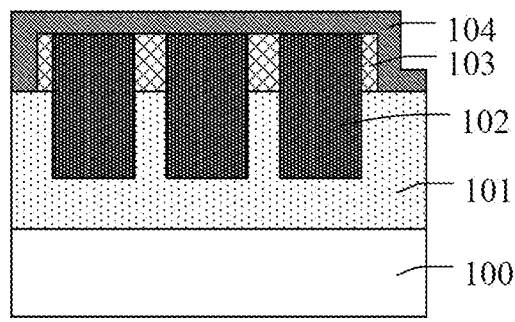

Referring to FIG. 14 to FIG. 15, FIG. 14 is a profile view based on FIG. 12, and FIG. 15 is a profile view based on FIG. 13. An etch stop layer 104 is formed at least in the groove 200, the etch stop layer 104 sealing the top of the groove 200.

A subsequent manufacture procedure further includes: forming a top dielectric layer covering the interconnecting wire 102, the etch stop layer 104, and the bottom dielectric layer 101, and forming a via within top dielectric layers on both sides of the groove 200 (shown in FIG. 8), the via exposing the top of the interconnecting wire 102. The etch stop layer 104 located on the top of the groove 200 can define an etch stop position in an etching process for forming the via, and it is difficult to cause mis-etching to an etch stop layer 104 located between adjacent interconnecting wires 102 in the via etching process, so that a probability that the via exposes the adjacent interconnecting wires 102 is reduced, or the via is prevented from being extremely close to the adjacent interconnecting wires 102, and after a via interconnecting structure filling the via is formed subsequently, a probability that a short circuit occurs between the via interconnecting structure and the adjacent interconnecting wires 102 is relatively small, thereby ensuring reliability and stability of the semiconductor structure while enlarging a process window for forming the via and improving a degree of freedom of a layout design of the via interconnecting structure.

In the semiconductor field, the top dielectric layer and the bottom dielectric layer 101 are generally made of the same material. In order to ensure that the etch stop layer 104 can define an etch stop position in the subsequent via etching process, the etch stop layer 104 is made of a material having a relatively large etch selectivity to the material of the bottom dielectric layer 101.

The etch stop layer 104 may be made of aluminum oxide, aluminum nitride, or NDC (Nitride Doped Carbon). The etch selection ratio of the bottom dielectric layer 101 to the material is relatively large, and selecting the material ensures that the etch stop layer 104 can define an etch stop position. In addition, both the materials are a dielectric material, and therefore relatively little influence is caused by the etch stop layer 104 to an electrical property of the semiconductor structure, and a subsequent step of removing the etch stop layer 104 is not needed.

In some implementations, the etch stop layer 104 is made of aluminum oxide. Aluminum oxide is an etch stop layer material commonly used in a back end of line manufacture procedure, which facilitates improvement of compatibility of the process for forming the etch stop layer 104 with an existing process while ensuring a corresponding process effect of etch stop layer 104. Furthermore, aluminum oxide is a wide band gap material, and aluminum alloy has a relatively good pressure-resistance property, which facilitates improvement of a breakdown voltage between a subsequent via interconnecting structure and adjacent interconnecting wires 102, thereby improving the reliability of the semiconductor structure.

In some implementations, the etch stop layer 104 covers the bottom and the side walls of the groove 200 conformally, and the etch stop layers 104 located on the side walls of the same groove 200 are in contact with each other, thereby filling the groove 200, and sealing the top of the groove 200 correspondingly. In particular, in a process of forming the etch stop layer 104, based on a specified value of a thickness of the etch stop layer 104 on the side wall of the groove 200, as a thickness of a deposited material increases, materials of the etch stop layers 104 on the side walls of the groove 200 are gradually in contact with each other, so that a finally formed etch stop layer 104 can fill the groove 200.

In some implementations, a side wall layer 103 is formed on the side wall of the groove 200, and therefore, the etch stop layer 104 is formed at least on a side wall of the side wall layer 103 in the groove 200, and the etch stop layers 104 located on side walls of the side wall layers 103 within the same groove 200 are in contact with each other.

Correspondingly, in the step of forming the etch stop layer 104, the thickness of the etch stop layer 104 is greater than or equal to one-half of a distance between the side wall layers 103 within the same groove 200, thereby ensuring that the etch stop layers 104 on side walls of adjacent side wall layers 103 within the same groove 200 are in contact with each other.

In some implementations, the etch stop layer 104 is formed using an atomic layer deposition process. The atomic layer deposition process has relatively good gap filling performance and step coverage capability, to improve a coverage capability of the etch stop layer 104 at the bottom and on the side walls of the groove 200. In addition, the atomic layer deposition process includes performing a plurality of atomic layer deposition cycles to form a film layer of a required thickness, which facilitates improvement of the thickness uniformity and the density of the etch stop layer 104, thereby controlling the thickness of the etch stop layer 104 accurately while improving an effect of the etch stop layer 104 for defining the etch stop position.

The atomic layer deposition process has a relatively strong step coverage capability, and therefore the etch stop layer 104 is further formed on the top of the interconnecting wire 102. The etch stop layer 104 located on the top of the interconnecting wire 102 can define an etch stop position in a subsequent via etching process, reducing a loss caused to the interconnecting wire 102 in the via etching process.

In other implementations, according to an actual process, an etch stop layer material may further be directly filled in the groove to form an etch stop layer. Correspondingly, the etch stop layer can be formed by a chemical vapor deposition process.

Figure 16:
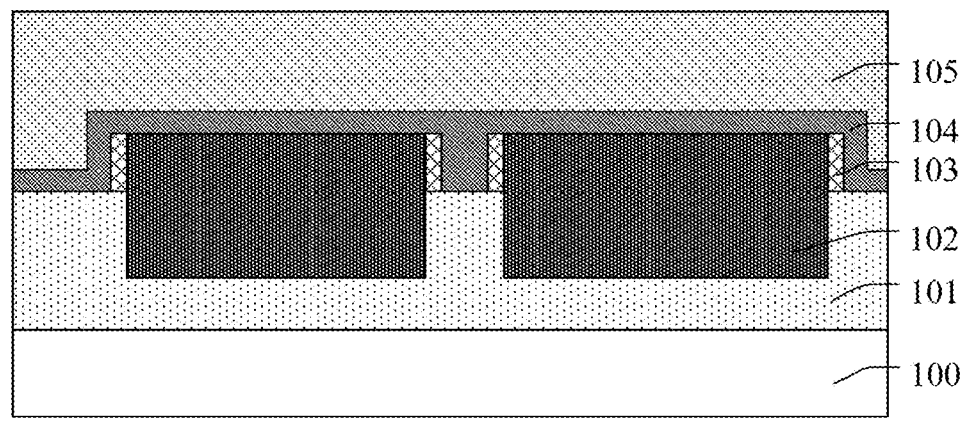
Figure 17:
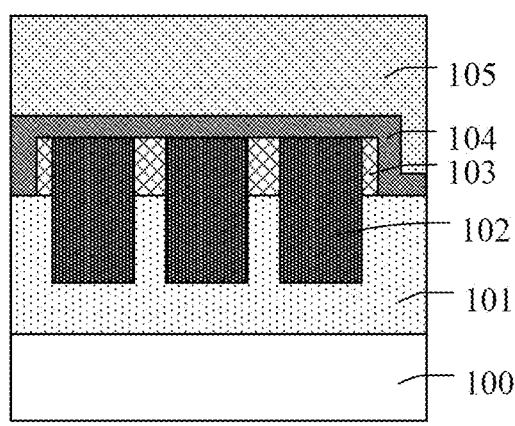

Referring to FIG. 16 to FIG. 17, FIG. 16 is a profile view based on FIG. 14, and FIG. 17 is a profile view based on FIG. 15. A top dielectric layer 105 covering the interconnecting wire 102, the etch stop layer 104, and the bottom dielectric layer 101 is formed.

The top dielectric layer 105 is configured to provide a process platform for forming a via interconnecting structure subsequently, and the top dielectric layer 105 is further configured to achieve electrical isolation between adjacent via interconnecting structures.

In some implementations, the top dielectric layer 105 is also an inter-metal dielectric (IMD) layer.

For this purpose, the dielectric layer 105 is made of a low-k dielectric material, an ultra-low-k dielectric material, silicon oxide, silicon nitride, or silicon oxynitride. In some implementations, the top dielectric layer 105 is made of a material same as that of the bottom dielectric layer 101, and the top dielectric layer 105 is made of an ultra-low-k dielectric material, to reduce a parasitic capacitance between back end of line interconnecting structures, thereby reducing a back end of line RC delay. In particular, the ultra-low-k dielectric material may be SiOCH.

Figure 18:
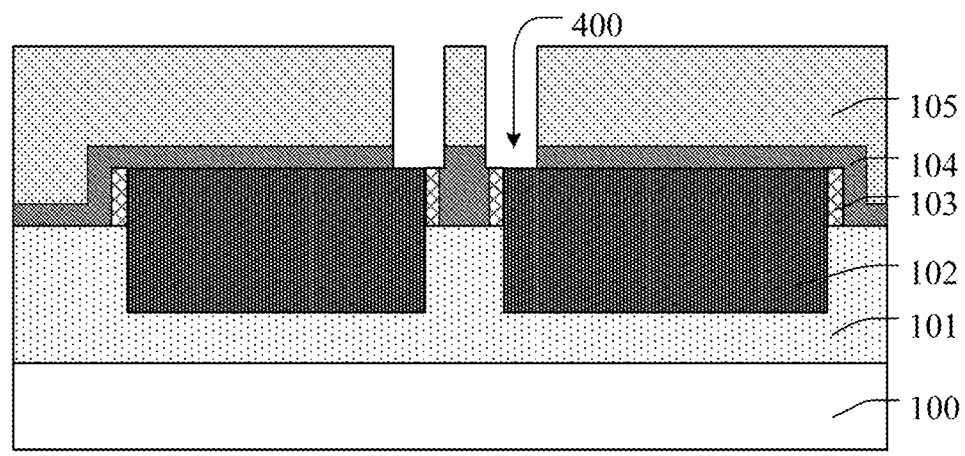
Figure 19:
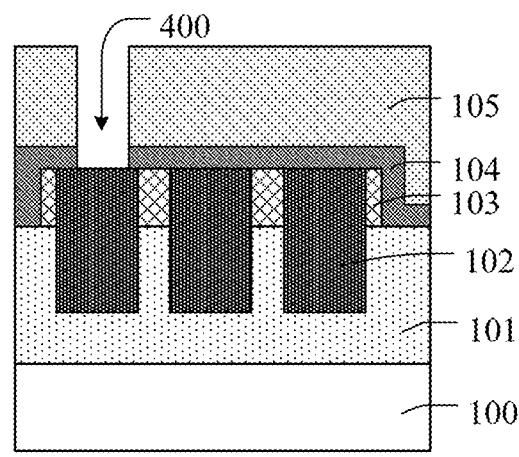

Referring to FIG. 18 to FIG. 19, FIG. 18 is a profile view based on FIG. 16, and FIG. 19 is a profile view based on FIG. 17. A via 400 is formed within the top dielectric layers 105 on both sides of the groove 200 (shown in FIG. 8), the via 400 exposing the top of the interconnecting wire 102.

The via 400 is configured to provide a spatial location for forming a via interconnecting structure.

The etch stop layer 104 located on the top of the groove 200 can define an etch stop position in an etching process for forming the via 400, and it is difficult to cause mis-etching to the etch stop layer 104 located between adjacent interconnecting wires 102 in the via etching process, so that a probability that the via 400 exposes adjacent interconnecting wires 102, or the via 400 from being extremely close to adjacent interconnecting wires 102, and after a via interconnecting structure filling the via 400 is formed subsequently, a probability that a short circuit occurs between the via interconnecting structure and adjacent interconnecting wires 102 is relatively small, thereby ensuring reliability and stability of the semiconductor structure while enlarging a process window for forming the via 400 and improving a degree of freedom of a layout design of the via interconnecting structure.

In particular, in some implementations, the via 400 further exposes the top of the side wall layer 103 and the portion of the top of the etch stop layer 104 within the groove 200, and even when a process for forming the via 400 has an overlay shift, it is also difficult to cause mis-etching to the etch stop layer 104 within the groove 200 in the etching process, thereby reducing difficulty of the via etching process and enlarging the process window.

In some implementations, the step of forming the via 400 includes: etching top dielectric layers 105 on both sides of the groove 200 and a portion of the top of the groove 200 using tops of etch stop layers 104 on the top of the interconnecting wire 102 and on the portion of the top of groove 200 as stop positions, to form an initial via (not shown in the figure) within the top dielectric layer 105, removing an etch stop layer 104 at a bottom of the initial via to expose the top of the interconnecting wire 102 and form the via 400 penetrating through the top dielectric layer 105 and the etch stop layer 104.

In the step of forming the initial via, top surfaces of the etch stop layers 104 located on the top of the interconnecting wire 102 and on the portion of the top of the groove 200 can define the etch stop positions, thereby reducing a probability of causing a damage to the interconnecting wire 102, and improving height consistency of bottom surfaces of initial vias.

In some implementations, the top dielectric layer 105 is etched using a dry etching process, to form the initial via. The dry etching process has anisotropic etching characteristics, which facilitates improvement of profile controllability of the initial via, helping a profile of the via 400 meet a process demand correspondingly.

In some implementations, the etch stop layer 104 at the bottom of the initial via is removed using a wet etching process. The wet etching process has a large etch selection ratio of the etch stop layer 104 to the interconnecting wire 102, which helps prevent a loss from being caused to the top of the interconnecting wire 102 while ensuring that the etch stop layer 104 at the bottom of the initial via is removed, thereby improving profile quality of the bottom of the via 400, and helping providing of a good interface state for forming a via interconnecting structure subsequently.

Figure 20:
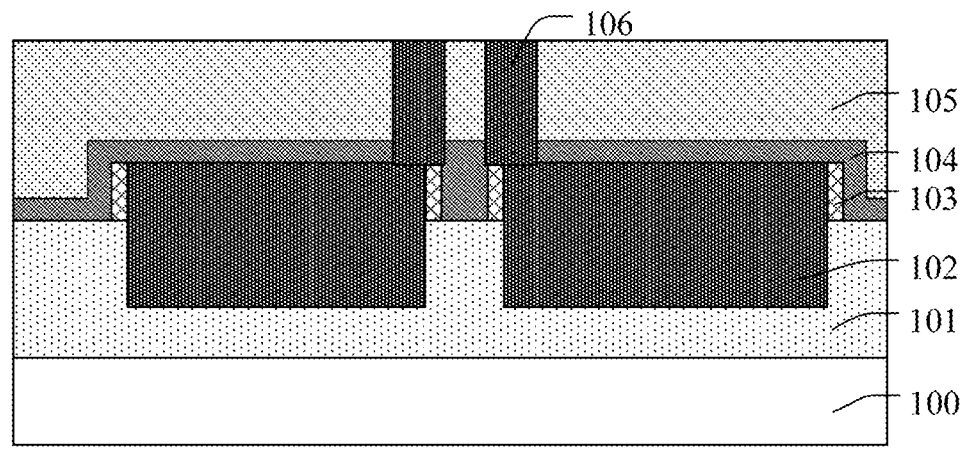
Figure 21:
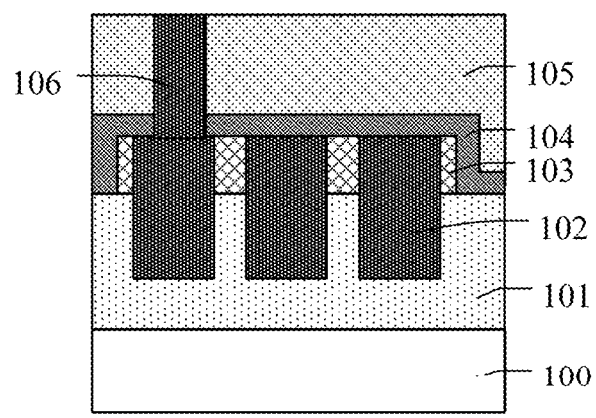

Referring to FIG. 20 to FIG. 21, FIG. 20 is a profile view based on FIG. 18, and FIG. 21 is profile view based on FIG. 19. A via interconnecting structure 106 filling the via 400 (shown in FIG. 18) is formed, the via interconnecting structure 106 being electrically connected to the interconnecting wire 102.

The via interconnecting structure 106 is configured to achieve an electrical connection between the interconnecting wire 102 and other interconnecting structures or an external circuit.

It can be learned from the above that the etch stop layer 104 located within the groove 200 reduces the probability that the via 400 (shown in FIG. 18) exposes the adjacent interconnecting wires 102 or that the via 400 is extremely close to the adjacent interconnecting wires 102. Therefore, a probability that a short circuit occurs between the via interconnecting structure 106 and the adjacent interconnecting wires 102 is relatively low, thereby ensuring reliability and stability of the semiconductor structure while increasing a degree of freedom of a layout design of the via interconnecting structure 106.

In particular, in some implementations, the via interconnecting structure 106 is further in contact with the top of the side wall layer 103 and the portion of the top of the etch stop layer 104 within the groove 200, that is, the via interconnecting structure 106 is in partial contact with the interconnecting wire 102.

In some implementations, the via interconnecting structure 106 is made of copper, which facilitates improvement of a signal delay of a back end of line RC, improvement of a processing speed of a chip, and reduction of power consumption.

In some implementations, the step of forming the via interconnecting structure 106 includes: forming a conductive material layer (not shown in the figure) filling the via 400, the conductive material layer further covering the top dielectric layer 105; flattening the conductive material layer using a top surface of the top dielectric layer 105 as a stop position, and using a remainder of the conductive material layer as the via interconnecting structure 106.

In some implementations, the conductive material layer is formed using an electroplating (ECP) process.

In some implementations, the conductive material layer is flattened using a chemical-mechanical polishing (CMP) process, which facilitates improvement of a flatness of a top surface of the via interconnecting structure 106.

FIG. 22 to FIG. 29 are respective schematic structural diagrams of steps in another form of a method for forming a semiconductor structure according to the present disclosure.

Similarities between some implementations and the foregoing embodiments and implementations are not described herein again. Some implementations described below differ from the foregoing implementations in a manner in which the etch stop layer seals the top of the groove and a manner in which the side wall layer seals the top of the trench.

Figure 22:
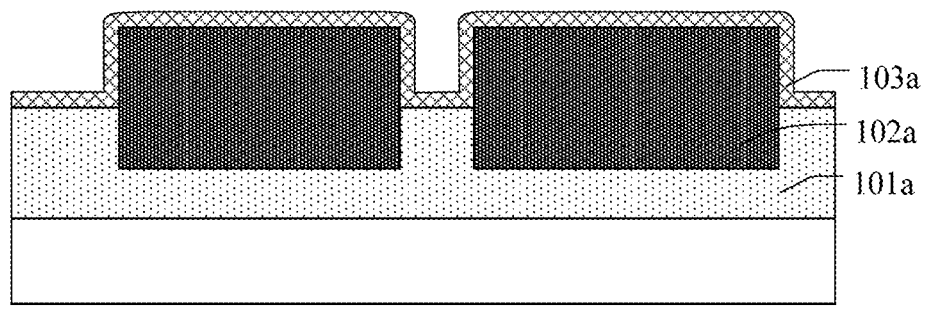
FIG. 22 to FIG. 29 are schematic structural diagrams of steps in one form of a method for forming a semiconductor structure.
Figure 23:
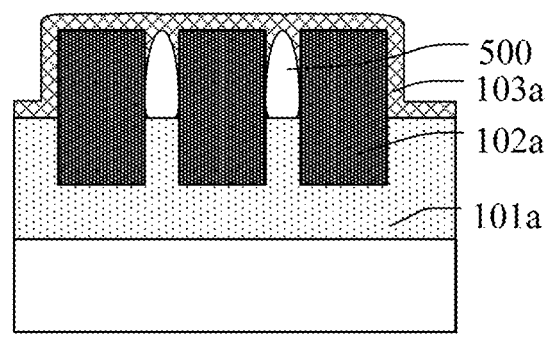

With reference to and referring to FIG. 22 to FIG. 23, FIG. 22 is a profile view along an extending direction of an interconnecting wire 102a, and FIG. 23 is a profile view along a direction perpendicular to the extending direction of the interconnecting wire 102a. After a portion of a thickness of a bottom dielectric layer 101a is etched, the method further includes: forming a side wall layer 103a covering a bottom and side walls of the groove (not marked) as well as the top of the interconnecting wire 102a conformally, the side wall layer 103a sealing the top of the trench (not marked).

In some implementations, in the step of forming the side wall layer 103a, the side wall layers 103a located at top corners of the same trench are in contact with each other to form a second air gap 500 (shown in FIG. 23).

A dielectric constant of air is lower than a dielectric constant of a dielectric material commonly used in a semiconductor process, and introducing the second air gap 500 between adjacent interconnecting wires 102a facilitates reduction of a parasitic capacitance between the adjacent interconnecting wires 102a, thereby improving an RC delay, a leakage current, and a TDDB characteristic.

In particular, in some implementations, the bottom dielectric layer 101a is etched by an amount greater than an amount by which the bottom dielectric layer in the foregoing embodiments is etched, and therefore a depth-to-width ratio of the trench is larger than that of the trench in the foregoing embodiments, a capability of the side wall layer 103a to fill the side walls and the bottom of the trench is relatively poor, a specific surface area of the top corner of the trench is larger, and a deposition rate of the side wall layer 103a at the top corner of the trench is faster. As a thickness of a deposited material increases, the side wall layers 103a located at the top corners of the same trench are in contact with each other, so that the side wall layers are closed on the top of the trench to form a second air gap 500.

Therefore, in some implementations, the second air gap 500 is formed by the side wall layer 103a located at the top corner of the trench and the side walls and the bottom of the trench.

In some implementations, the side wall layer 103a is formed using a chemical vapor deposition process. A gap filling capability of the chemical vapor deposition process is relatively poor, which facilitates improvement of a probability of forming the second air gap 500. In other implementations, the side wall layer may also be formed using an atomic layer deposition process.

In other implementations, when a profile of the interconnecting wire is an inverted trapezoid, that is, in an upward direction along a normal line of a surface of the bottom dielectric layer, a distance between the side walls of the trench is increasingly smaller, and in the step of forming the side wall layer, the side wall layers located at the top corners of the same trench are also in contact with each other to form the second air gap.

In some other implementations, the second air gap can also be formed when the side wall layer is formed using a process with a relatively poor gap filling capability.

Figure 24:
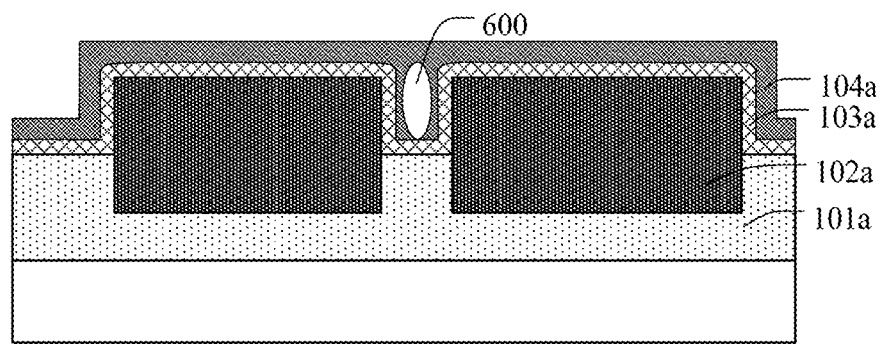
Figure 25:
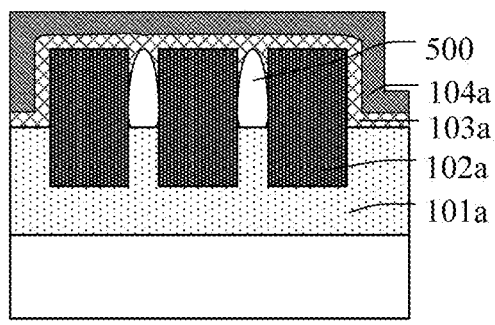

Referring to FIG. 24 to FIG. 25, FIG. 24 is a profile view based on FIG. 22, and FIG. 25 is a profile view based on FIG. 23. An etch stop layer 104a is formed at least in the groove (not marked), the etch stop layer 104a sealing the top of the groove.

In some implementations, in the step of forming the etch stop layer 104a, the etch stop layer 104a covers a bottom and side walls of the groove, as well as the top of the interconnecting wire 102a conformally, and the etch stop layers 104a located at top corners of the same groove are in contact with each other to form a first air gap 600.

A dielectric constant of air is lower than a dielectric constant of a dielectric material commonly used in a semiconductor process, and introducing the first air gap 600 between adjacent interconnecting wires 102a facilitates further reduction of a parasitic capacitance between the adjacent interconnecting wires 102a, thereby improving an RC delay, a leakage current, and a TDDB characteristic.

In particular, in some implementations, the bottom dielectric layer 101a is etched by an amount greater than an amount by which the bottom dielectric layer in the foregoing embodiments and implementations is etched, and therefore a depth-to-width ratio of the groove is larger than that of the groove in the foregoing embodiments and implementations, a capability of the side wall layer 104a to fill the side walls and the bottom of the groove is relatively poor, a specific surface area of a top corner of the groove is larger, and a deposition rate of the side wall layer 104a at the top corner of the groove is faster. As a thickness of a deposited material increases, side wall layers 104a at top corners of the same groove are in contact with each, so that the side wall layers are closed at the top of the groove, and the etch stop layers 104a located at the top corners of the groove and the side walls and the bottom of the groove form the first air gap 600.

In other implementations, when a profile of the interconnecting wire is an inverted trapezoid, that is, in an upward direction along a normal line of a surface of the bottom dielectric layer, a distance between the side walls of the groove is increasingly smaller, and in the step of forming the side wall layer, etch stop layers located at the top corners of the same groove are also in contact with each other to form the second air gap.

In some other implementations, the second air gap can also be formed when the etch stop layer is formed using a process with a relatively poor gap filling capability.

Figure 26:
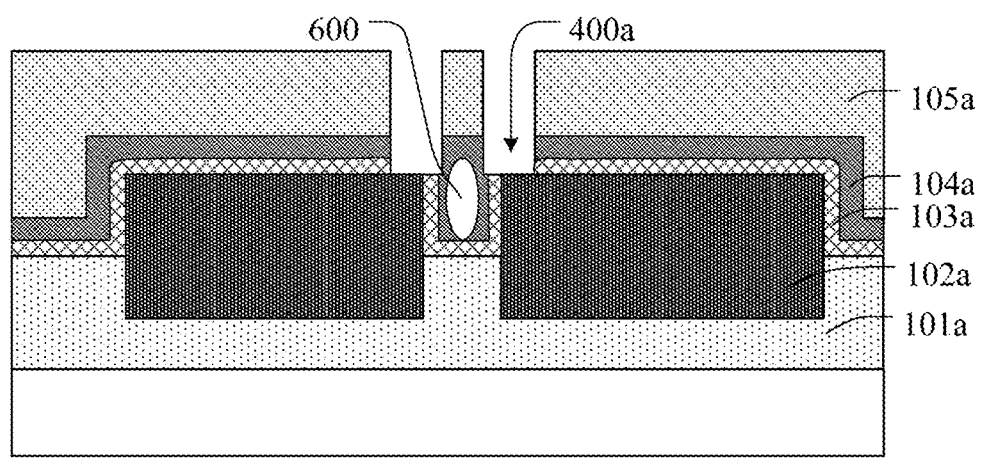
Figure 27:
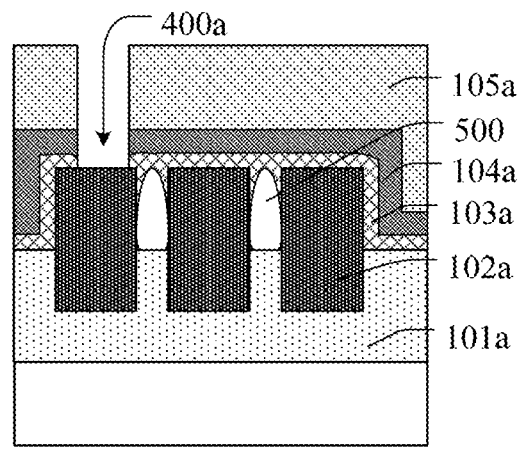

Referring to FIG. 26 to FIG. 27, FIG. 26 is a profile view based on FIG. 24, and FIG. 27 is a profile view based on FIG. 25. A top dielectric layer 105a covering the interconnecting wire 102a, the etch stop layer 104a, and the bottom dielectric layer 101a is formed.

The step of forming the top dielectric layer 105a is the same as those in the foregoing embodiments, and details are not described herein again.

Still referring to FIG. 26 to FIG. 27, a via 400a is formed within top dielectric layers 105a on both sides of the groove, the via 400a exposing the top of the interconnecting wire 102a.

The step of forming the via 400a is the same as those in the foregoing embodiments and implementations, and details are not described herein again.

Figure 28:
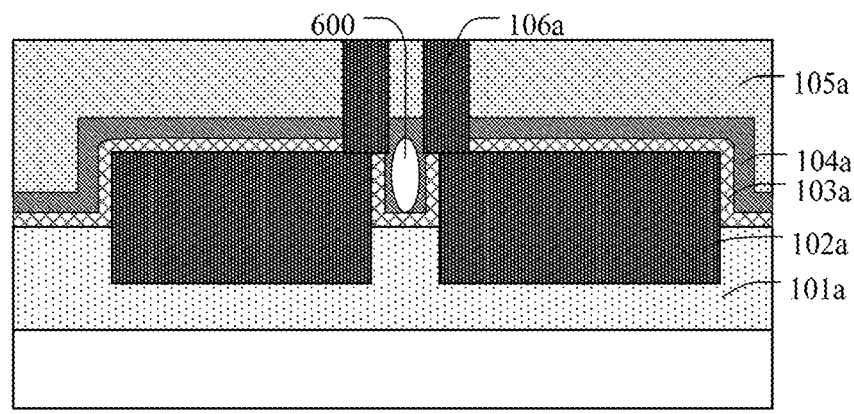
Figure 29:
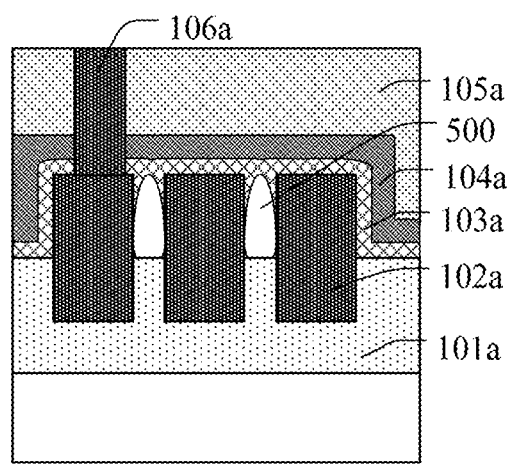

Referring to FIG. 28 to FIG. 29, a via interconnecting structure 106a filling the via 400a is formed, the via interconnecting structure 106a being electrically connected to the interconnecting wire 102a.

The step of forming the via interconnecting structure 106a is the same as those in the foregoing embodiments, and details are not described herein again.

The present disclosure further provides a semiconductor structure. Referring to FIG. 20 to FIG. 21, FIG. 20 is a profile view along an extending direction of the interconnecting wire, and FIG. 21 is a profile view along a direction perpendicular to the extending direction of the interconnecting wire, showing schematic structural diagrams of an embodiment of the semiconductor structure according to the present disclosure.

The semiconductor structure includes: a base 100; a bottom dielectric layer 101 located on the base 100; an interconnecting wire 102 located within the bottom dielectric layer 101, the top of the interconnecting wire 102 being higher than the top of the bottom dielectric layer 101, and along the extending direction of the interconnecting wire 102, adjacent interconnecting wires 102 and the bottom dielectric layer 101 forming a groove 200 (shown in FIG. 8); an etch stop layer 104 located at least in the groove 200 and sealing the top of the groove 200; a top dielectric layer 105 covering the interconnecting wire 102, the etch stop layer 104, and the bottom dielectric layer 101; a via interconnecting structure 106 located within top dielectric layers 105 on both sides of the groove 200, the via interconnecting structure 106 being electrically connected to the interconnecting wire 102.

Forming the via interconnecting structure 106 generally includes a step of etching the top dielectric layer 105 to form a via. The etch stop layer 104 located on the top of the groove 200 can define an etch stop position in the etching process, and it is difficult to cause mis-etching to the etch stop layer 104 located between adjacent interconnecting wires 102 in the etching process, thereby reducing a probability that the via exposes the adjacent interconnecting wires 102, or the via is prevented from being extremely close to the adjacent interconnecting wires 102, and correspondingly, after the via interconnecting structure 106 filling the via is formed, a probability that a short circuit occurs between the via interconnecting structure 106 and the adjacent interconnecting wires 102 is relatively small, thereby ensuring reliability and stability of the semiconductor structure while enlarging a process window for forming the via and improving a degree of freedom of a layout design of the via interconnecting structure 106.

In some implementations, for example, a formed semiconductor structure is a planar transistor. The base 100 includes a substrate (not shown in the figure). In particular, the substrate is a silicon substrate. In other implementations, the substrate may also be made of other materials such as germanium, silicon germanium, silicon carbide, gallium arsenide, or indium gallium, and the substrate may also be other types of substrates such as a silicon substrate on an insulator or a germanium substrate on an insulator.

In other implementations, when the formed semiconductor structure is a fin field effect transistor, the base may include a substrate and a fin protruding from the substrate correspondingly.

The base 100 may further include other structures such as a gate structure, a doped region, a shallow trench isolation structure, and a dielectric layer, etc. The gate structure may be a metal gate structure or a polysilicon gate structure.

In some implementations, the bottom dielectric layer 101 is an inter-metal dielectric layer. The bottom dielectric layer 101 is configured to provide a process platform for forming the interconnecting wire 102, and the bottom dielectric layer 101 is further configured to achieve electric isolation between adjacent interconnecting wire structures in a back end of line manufacture procedure.

In particular, the bottom dielectric layer 101 is a first inter-metal dielectric layer configured to achieve electrical isolation between first metal interconnecting wires (that is, M1 layers). The first interconnecting wire refers to an interconnecting structure closest to a contact plug.

In other implementations, the bottom dielectric layer may also be an inter-metal dielectric layer located on the first metal interconnecting wire configured to achieve electrical isolation between other interconnecting structures. In particular, the bottom dielectric layer is a second inter-metal dielectric layer configured to achieve electric isolation between a second metal interconnecting wire and a via interconnecting structure located between the second metal interconnecting wire and the first metal interconnecting wire.

For this purpose, the bottom dielectric layer 101 is made of a low-k dielectric material, an ultra-low-k dielectric material, silicon oxide, silicon nitride, or silicon oxynitride. In some implementations, the bottom dielectric layer 101 is made of an ultra-low-k dielectric material, to reduce a parasitic capacitance between back end of line interconnecting structures, thereby reducing a back end of line RC delay. In particular, the ultra-low-k dielectric material may be SiOCH.

The interconnecting wire 102 is configured to achieve an electrical connection between the base 100 and an external circuit or other interconnecting structures. In some implementations, the interconnecting wire 102 is a first metal (M1) interconnecting wire.

In some implementations, the interconnecting wire 102 is made of copper, which facilitates improvement of a signal delay of a back end of line RC, improvement of a processing speed of a chip, and reduction of power consumption.

In some implementations, the semiconductor structure further includes: a metal block layer (not shown in the figure) located on a bottom surface, a side wall, and a top surface of the interconnecting wire 102. The metal block layer is configured to improve an adhesion between the interconnecting wire 102 and other film layer structures, and the metal block layer is further configured to block a material of the interconnecting wire 102 from spreading to the other film layer structure. In some implementations, the metal block layer is made of tantalum nitride.

The groove 200 is configured to provide a process platform for forming the etch stop layer 104.

In the semiconductor field, the top dielectric layer 105 and the bottom dielectric layer 101 are generally made of a same material. In order to ensure that the etch stop layer 104 can define an etch stop position in a via etching process, the etch stop layer 104 is made of a material having a relatively large etch selectivity to a material of the bottom dielectric layer 101.

The etch stop layer 104 may be made of aluminum oxide, aluminum nitride, or NDC (Nitride Doped Carbon). The etch selection ratio of the bottom dielectric layer 101 to the material is relatively large, and selecting the material ensures that the etch stop layer 104 can define an etch stop position. In addition, both the materials are a dielectric material, and therefore relatively little influence is caused by the etch stop layer 104 to an electrical property of the semiconductor structure, and the etch stop layer 104 can be reserved in the semiconductor structure.

In some implementations, the etch stop layer 104 is made of aluminum oxide. Aluminum oxide is an etch stop layer material commonly used in a manufacture procedure of a back end of line process, which facilitates improvement of process compatibility while ensuring a corresponding process effect of the etch stop layer 104. Furthermore, aluminum oxide is a wide band gap material, and the aluminum alloy has a relatively good pressure-resistance property, which facilitates improvement of a breakdown voltage between the via interconnecting structure 106 and the adjacent interconnecting wires 102.

In some implementations, the etch stop layer 104 is located at least on the bottom and the side walls of the groove 200, and the etch stop layers 104 located on the side walls of the same groove 200 are in contact with each other to fill the groove 200, and seal the top of the groove 200 correspondingly.

In other implementations, actual process requirements, the etch stop layer may also be filled in the groove.

In some implementations, the etch stop layer 104 is further located between the interconnecting wire 102 and the top dielectric layer 105, and the etch stop layer 104 located between the interconnecting wire 102 and the top dielectric layer 105 can define an etch stop position of a via etching process, thereby reducing a loss caused to the interconnecting wire 102 in the via etching process.

The top dielectric layer 105 is configured to provide a process platform for forming the via interconnecting structure 106, and the top dielectric layer 105 is further configured to achieve electrical isolation between adjacent via interconnecting structures 106.

In some implementations, the top dielectric layer 105 is also an inter-metal dielectric (IMD) layer.

For this purpose, the top dielectric layer 105 is made of a low-k dielectric material, an ultra-low-k dielectric material, silicon oxide, silicon nitride, or silicon oxynitride. In some implementations, the top dielectric layer 105 is made of a material same as that of the bottom dielectric layer 101, and the top dielectric layer 105 is made of an ultra-low-k dielectric material, to reduce a parasitic capacitance between back end of line interconnecting structures, thereby reducing a back end of line RC delay. In particular, the ultra-low-k dielectric material may be SiOCH.

The via interconnecting structure 106 is configured to achieve an electrical connection between the interconnecting wire 102 and other interconnecting structures or an external circuit.

It can be learned from the above that the etch stop layer 104 located within the groove 200 reduces a probability that a short circuit occurs between the via interconnecting structure 106 and the adjacent interconnecting wires 102, thereby ensuring reliability and stability of the semiconductor structure while increasing a degree of freedom of a layout design of the via interconnecting structure 106.

In particular, in some implementations, the via interconnecting structure 106 is further in contact with the top of the side wall layer 103 and a portion of the top of the etch stop layer 104 within the groove 200, that is, the via interconnecting structure 106 is in partial contact with the interconnecting wire 102.

In some implementations, the via interconnecting structure 106 is made of copper, which facilitates improvement of a signal delay of a back end of line RC and improvement of a processing speed of a chip, and also facilitates reduction of power consumption.

It should be noted that, in the semiconductor field, compared with a distance between the adjacent interconnecting wires 102 along the extending direction of the interconnecting wire 102, a space between the adjacent interconnecting wires 102 along a direction perpendicular to the extending direction of the interconnecting wire 102 is usually smaller.

Therefore, along the extending direction of the interconnecting wire 102, an opening width of the groove 200 is a first width w1 (shown in FIG. 8), and along the direction perpendicular to the extending direction of the interconnecting wire 102, the adjacent interconnecting wires 102 and the bottom dielectric layer 101 form a trench 300 (shown in FIG. 9), an opening width of the trench 300 being a second width w2 (shown in FIG. 9), and the second width w2 being smaller than the first width w1.

In some implementations, the semiconductor structure further includes: a side wall layer 103 located at least between the etch stop layer 104 and the side wall of the groove 200, the side wall layer 103 sealing the top of the trench 300.

In some implementations, the first width w1 is greater than the second width w2, that is, a depth-to-width ratio of the trench 300 is larger than that of the groove 200. The side wall layer 103 seals the top of the trench 300, thereby preventing the etch stop layer 104 from being located within the trench 300, and reducing difficulty in forming the etch stop layer 104. In addition, the side wall layer 103 further occupies a portion of a space of the groove 200, so that an excessively thick etch stop layer 104 for ensuring that the etch stop layer 104 can seal the top of the groove 200 is avoided, thereby improving profile quality of a top surface of the etch stop layer 104, and shortening a process time costed to form the etch stop layer 104, while reducing process difficulty in forming the etch stop layer 104 and improving process compatibility.

A dielectric constant of a material of the side wall layer 103 is lower than a dielectric constant of a material of the etch stop layer 104, and the side wall layer 103 is made of a low-k dielectric material, an ultra-low-k dielectric material, silicon oxide, or carbon-containing silicon oxide. Therefore, compared with a solution in which no side wall layer is formed, dispose of the side wall layer 103 further facilitates reduction of a parasitic capacitance between the adjacent interconnecting wires 102, facilitating improvement of a TDDB characteristic. In some implementations, the side wall layer 103 is made of silicon oxide.

In some implementations, the side wall layer 103 further covers the bottom and side walls of the trench 300 conformally, and the side wall layers 103 located on side walls of the same trench 300 are in contact with each other, thereby filling the trench 300, and sealing the top of the trench 300 correspondingly.

In some implementations, the side wall layer 103 is located only on the side wall of the trench 300, which facilitates enlargement of a volume of the etch stop layer 104 located within the groove 200, and correspondingly increasing of an effect of the etch stop layer 104 to for preventing a short circuit from occurring between the via interconnecting structure 106 and the adjacent interconnecting wires 102. Compared with a solution in which the side wall layer is further located on the top of the interconnecting wire, in some implementations, the etch stop layer 104 is further located between the interconnecting wire 102 and the top dielectric layer 105, and in a via etching process step of forming the via interconnecting structure 106, after the dielectric layer 101 is etched, only the etch stop layer 104 needs to be etched, so that etching of a side wall layer at a bottom of the etch stop layer is avoided, thereby preventing a loss from being caused to the interconnecting wire 102 in the etching process.

In other implementations, the side wall layer may be further located at the bottom of the groove and on the top of the interconnecting wire.

FIG. 28 to FIG. 29 are schematic structural diagrams of another form of a semiconductor structure according to the present disclosure.

Similarities between implementations described below and the foregoing embodiments and implementations are not described herein again. Some implementations described below differ from the foregoing embodiments and implementations in a manner in which the etch stop layer seals the top of the groove and a manner in which the side wall layer seals the top of the trench.

In some implementations, the etch stop layer 104a covers the bottom and the side walls of the groove (not marked), as well as the top of the interconnecting wire 102a conformally, and etch stop layers 104a located at top corners of the same groove are in contact with each other to form a first air gap 600.

A dielectric constant of air is lower than a dielectric constant of a dielectric material commonly used in a semiconductor process, and introducing the first air gap 600 between adjacent interconnecting wires 102a facilitates further reduction of a parasitic capacitance between the adjacent interconnecting wires 102a, thereby improving an RC delay, a leakage current, and a TDDB characteristic.

In some implementations, a height of the top of the bottom dielectric layer 101a is smaller than a height of the top of the bottom dielectric layer in the foregoing embodiments, and therefore a depth-to-width ratio of the groove is greater than a depth-to-width ratio of the groove in the foregoing embodiments, which helps introducing the first air gap 600 into the groove. In particular, the etch stop layers 104a located at the top corners of the groove and the side walls and the bottom of the groove form the first air gap 600.

In other implementations, when a profile of the interconnecting wire is an inverted trapezoid, it also helps introduce the first air gap into the groove.

In some implementations, the side wall layers 103a located at the top corners of the same groove (not marked) are in contact with each other to form a second air gap 500.

Introducing the second air gap 500 between the adjacent interconnecting wires 102a facilitates further reduction of parasitic capacitance between the adjacent interconnecting wires 102a, thereby improving an RC delay, a leakage current, and a TDDB characteristic.

In some implementations, a height of the top of the bottom dielectric layer 101a is smaller than a height of the top of the bottom dielectric layer in the foregoing embodiments, and therefore a depth-to-width ratio of the groove is larger than a depth-to-width ratio of the groove in the foregoing embodiment, which helps introduce the second air gap 500 into the groove. In particular, the second air gap 500 is formed by the side wall layer 103a located at the top corner of the groove and the side walls and the bottom of the groove.

In other implementations, when a profile of the interconnecting wire is an inverted trapezoid, it also helps introduce the second air gap into the groove.

The semiconductor structure may be formed using the forming method described in the foregoing embodiments, or may be formed using other forming methods. For detailed descriptions of the semiconductor structure in some implementations, reference may be made to the respective descriptions in the foregoing embodiments, and details are not described again in some implementations.

The present disclosure is not limited to the above. Various changes and modifications may be made by a person skilled in the art without departing from the spirit and scope of the present disclosure, and thus the scope of the present disclosure should be subject to the scope defined by the claims.

What is claimed is:

1. A method for forming a semiconductor structure, comprising:
   providing a base, a bottom dielectric layer formed on the base, and an interconnecting wire located within the bottom dielectric layer being formed on the base, wherein the bottom dielectric layer exposes a top of the interconnecting wire;
   etching a portion of a thickness of the bottom dielectric layer, along an extending direction of the interconnecting wire, where adjacent interconnecting wires and a remainder of the bottom dielectric layer form a groove, along the extending direction of the interconnecting wire, an opening width of the groove is a first width, and along a direction perpendicular to the extending direction of the interconnecting wire, the adjacent interconnecting wires and the bottom dielectric layer form a trench, an opening width of the trench is a second width, and the second width is smaller than the first width;
   after etching the portion of the thickness of the bottom dielectric layer, forming a side wall layer that covers the bottom and side walls of the groove, as well as the top of the interconnecting wire conformally, the side wall layer sealing the top of the trench;
   after forming the side wall layer, forming an etch stop layer at least in the groove, the etch stop layer sealing a top of the groove;
   forming a top dielectric layer covering the interconnecting wire, the etch stop layer, and the bottom dielectric layer;
   forming a via within top dielectric layers on both sides of the groove, the via exposing the top of the interconnecting wire;
   forming a via interconnecting structure filling the via, the via interconnecting structure being electrically connected to the interconnecting wire.

2. The method of claim 1, wherein in the step of forming the etch stop layer, the etch stop layer covers a bottom and side walls of the groove conformally, and the etch stop layers located on side walls of the same groove are in contact with each other.

3. The method of claim 1, wherein in the step of forming the etch stop layer, the etch stop layer covers a bottom and side walls of the groove, as well as the top of the interconnecting wire conformally, and etch stop layers located at top corners of the same groove are in contact with each other to form a first air gap.

4. The method of claim 1, wherein in the step of forming the groove, a depth-to-width ratio of the groove is from 0.2 to 1.5.

5. The method of claim 1, wherein the method further comprises, after the side wall layer is formed and before the etch stop layer is formed, removing side wall layers at the bottom of the groove and on the top of the interconnecting wire.

6. The method of claim 1, wherein in the step of forming the side wall layer, the side wall layer further covers a bottom and side walls of the trench conformally, and the side wall layers located on side walls of the same trench are in contact with each other.

7. The method of claim 1, wherein in the step of forming the side wall layer, side wall layers located at top corners of the same trench are in contact with each other to form a second air gap.

8. The method of claim 1, wherein:
   in the step of forming the etch stop layer, the etch stop layer is further formed on the top of the interconnecting wire; and
   the step of forming the via comprises:
      etching the top dielectric layer on both sides of the groove using a top of the etch stop layer on the top of the interconnecting wire as a stop position, to form an initial via within the top dielectric layers; and
      removing an etch stop layer at a bottom of the initial via, to form a via penetrating through the top dielectric layer and the etch stop layer.

9. The method of claim 1, wherein the etch stop layer is formed using an atomic layer deposition process.

10. The method of claim 1, wherein in the step of forming the etch stop layer, the etch stop layer is made of aluminum oxide, aluminum nitride, or NDC.

11. The method of claim 1, wherein a process for forming the side wall layer comprises an atomic layer deposition process or a chemical vapor deposition process.

12. The method of claim 1, wherein in the step of forming the side wall layer, the side wall layer is made of a low-k dielectric material, an ultra-low-k dielectric material, silicon oxide, or carbon-containing silicon oxide.

13. A semiconductor structure, comprising:
   a base;
   a bottom dielectric layer located on the base;
   an interconnecting wire located within the bottom dielectric layer, a top of the interconnecting wire being higher than a top of the bottom dielectric layer, where a groove is formed, along an extending direction of the interconnecting wire, by adjacent interconnecting wires and the bottom dielectric layer, along the extending direction of the interconnecting wire, an opening width of the groove is a first width, and along a direction perpendicular to the extending direction of the interconnecting wire, adjacent interconnecting wires and the bottom dielectric layer form a trench, an opening width of the trench is a second width, and the second width is smaller than the first width;
   an etch stop layer located at least in the groove and sealing a top of the groove;
   a side wall layer located at least between the etch stop layer and a side wall of the groove, the side wall layer sealing the top of the trench;
   a top dielectric layer covering the interconnecting wire, the etch stop layer, and the bottom dielectric layer;
   a via interconnecting structure located within top dielectric layers on both sides of the groove, the via interconnecting structure being electrically connected to the interconnecting wire.

14. The semiconductor structure according to claim 13, wherein the etch stop layer is located at least on a bottom and side walls of the groove, and the etch stop layers located on side walls of the same groove are in contact with each other.

15. The semiconductor structure according to claim 13, wherein the etch stop layer covers a bottom and side walls of the groove, as well as the top of the interconnecting wire conformally, and etch stop layers located at top corners of the same groove are in contact with each other to form a first air gap.

16. The semiconductor structure according to claim 13, wherein the etch stop layer covers a bottom and side walls of the groove, as well as the top of the interconnecting wire conformally.

17. The semiconductor structure according to claim 13, wherein the side wall layer further covers a bottom and side walls of the trench conformally, and the side wall layers located on side walls of the same trench are in contact with each other.

18. The semiconductor structure according to claim 13, wherein tops of side wall layers located at top corners of the same trench are in contact with each other to form a second air gap.

19. The semiconductor structure according to claim 13, wherein the etch stop layer is made of aluminum oxide, aluminum nitride, or NDC.

20. The semiconductor structure according to claim 13, wherein the side wall layer is made of a low-k dielectric material, an ultra-low-k dielectric material, silicon oxide, or carbon-containing silicon oxide.

21. The semiconductor structure according to claim 13, wherein the etch stop layer is further located between the interconnecting wire and the top dielectric layer.

* * * * *